United States Patent [19]
Naito et al.

[11] Patent Number: 4,940,938
[45] Date of Patent: * Jul. 10, 1990

[54] METHOD AND DEVICE FOR MEASURING CHARACTERISTIC MAGNETIC DISTRIBUTION OF A MAGNETIC THIN FILM USING A MAGNETIC HEAD

[75] Inventors: Seishi Naito; Shuji Tanabe; Toru Nakashima, all of Himeji, Japan

[73] Assignee: Glory Kogyo Kabushiki Kaisha, Hyogo, Japan

[*] Notice: The portion of the term of this patent subsequent to Feb. 13, 2007 has been disclaimed.

[21] Appl. No.: 163,104

[22] Filed: Mar. 2, 1988

[30] Foreign Application Priority Data

Mar. 2, 1987 [JP] Japan .................................. 62-47176
Jun. 15, 1987 [JP] Japan ................................ 62-148736

[51] Int. Cl.$^5$ ............................................ G01R 33/12
[52] U.S. Cl. ........................................ 324/212; 360/31
[58] Field of Search ............................... 324/210–212, 324/239, 241–243; 360/31, 123, 131

[56] References Cited

U.S. PATENT DOCUMENTS 4,752,739  6/1980  Wang ............................... 324/207

Primary Examiner—Reinhard J. Eisenzopf
Assistant Examiner—Walter E. Snow
Attorney, Agent, or Firm—Wenderoth, Lind & Ponack

[57] ABSTRACT

Primary and secondary coils are wound on a differential type magnetic head, and a low frequency signal is applied on the primary coil. Based on the difference between the output voltages from the head when an object of detection is placed near the magnetic head on the detection side and the output voltage therefrom when an object is not placed near the magnetic head, the magnetization characteristic curve of the magnetic flux and the magnetic field is calculated. Since the magnetization characteristic detection is determined by dividing a magnetic flux by the measured area cross section, once the magnetic flux is determined, a general B-H curve can be simply calculated. The magnetization characteristic measurement device includes a differential type magnetic head portion having plural differential type magnetic heads in linear arrangement which is positioned on or near the magnetic thin film of a detection object. The device can calculate magnetization characteristics of the magnetic thin film by applying a low frequency signal on the magnetic head, successively switching differential output voltages given to a cancellation core of the plural differential magnetic cores by a data converting section into digital data, and conducting software integration by a measured data analyzing section based on the data.

18 Claims, 13 Drawing Sheets

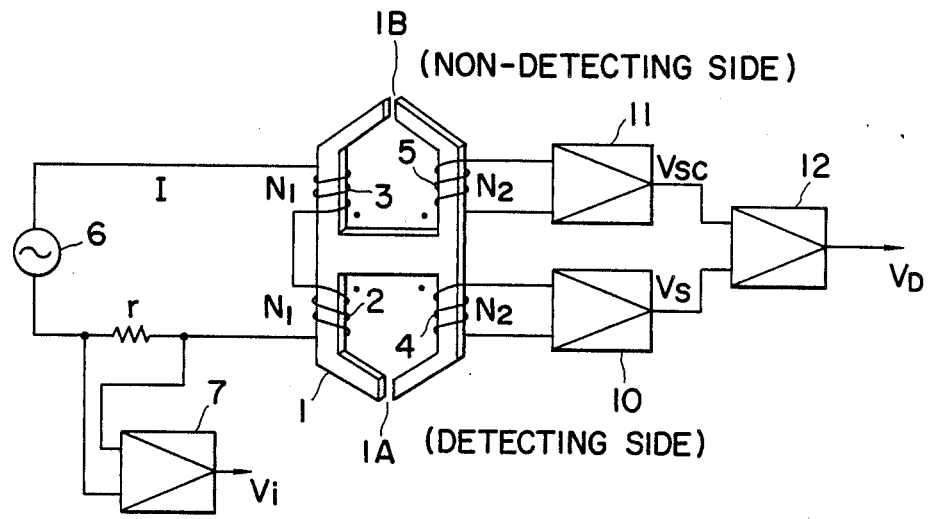
F I G. 3

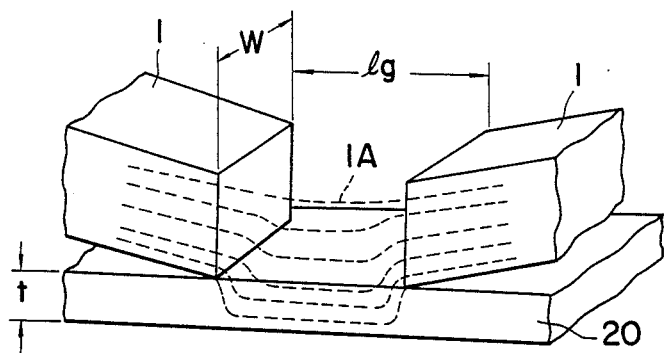
F I G. 4
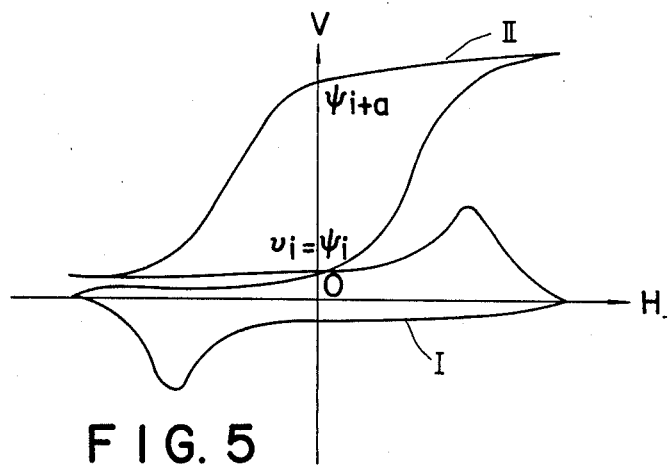
F I G. 5
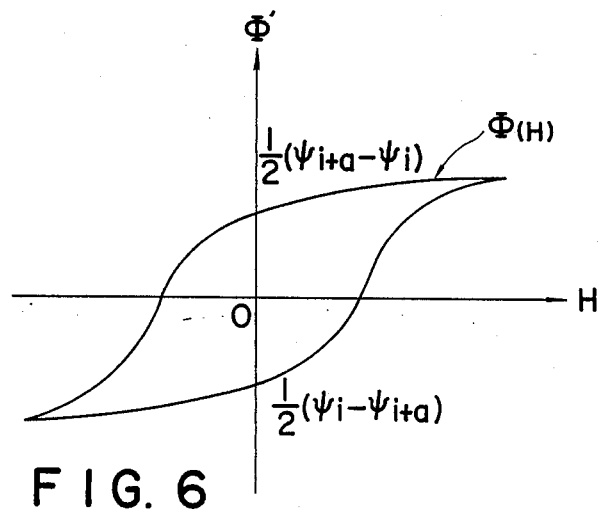
F I G. 6

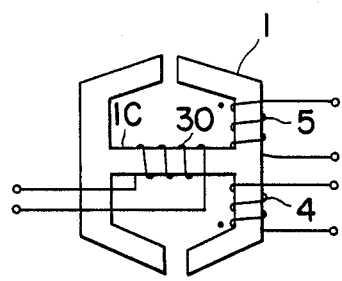
F I G. 7
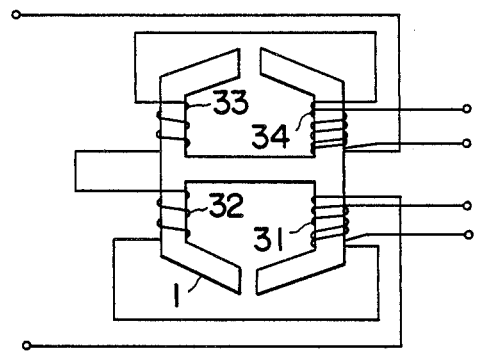
F I G. 8
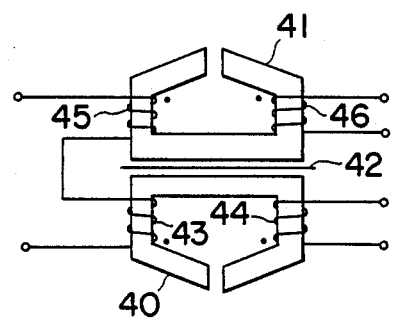
F I G. 9
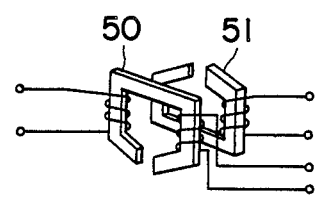
F I G. 10

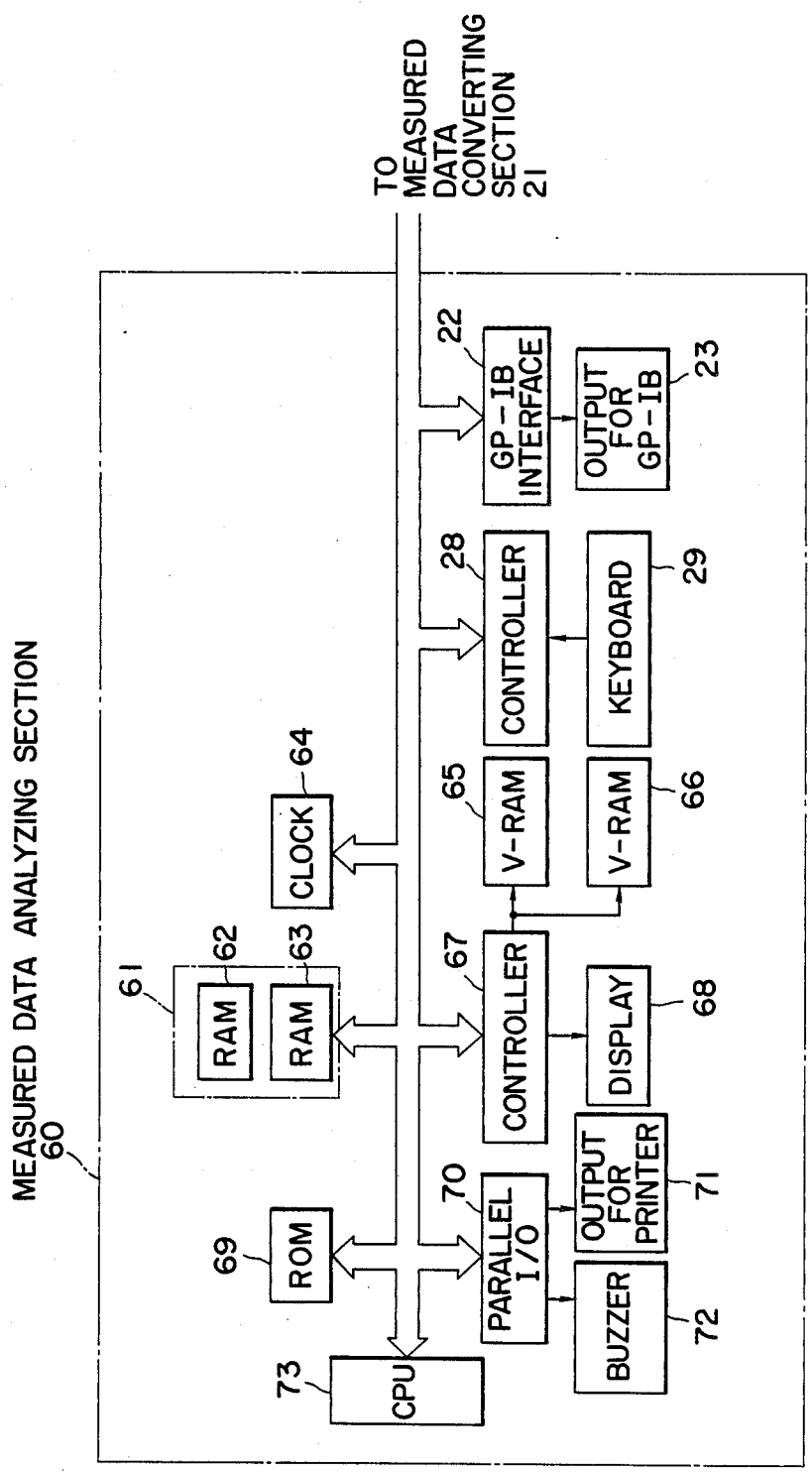
F I G. 13

FIG.17A
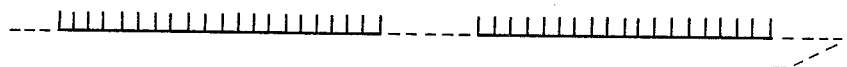
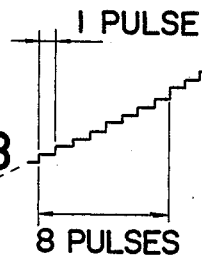
FIG.17B
8 PULSES
FIG.17C
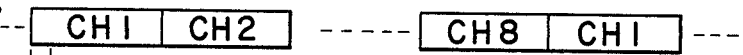
FIG.17D
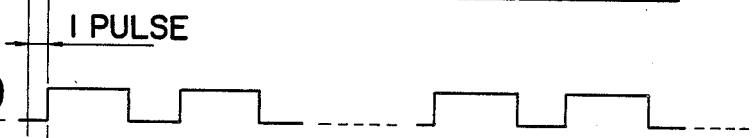
FIG.17E

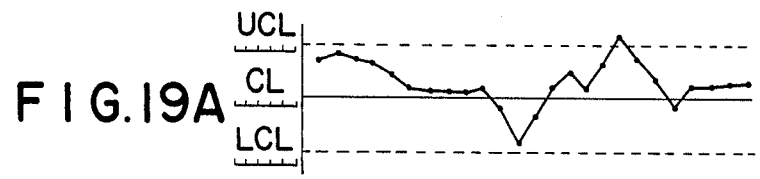
F I G. 19A
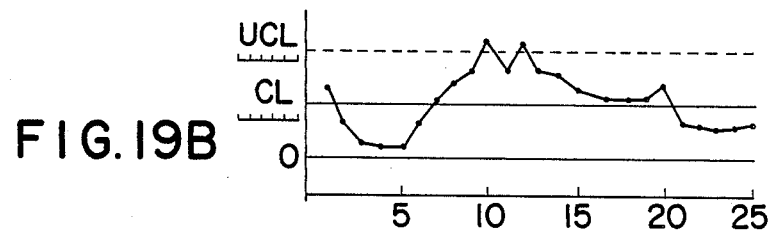
F I G. 19B
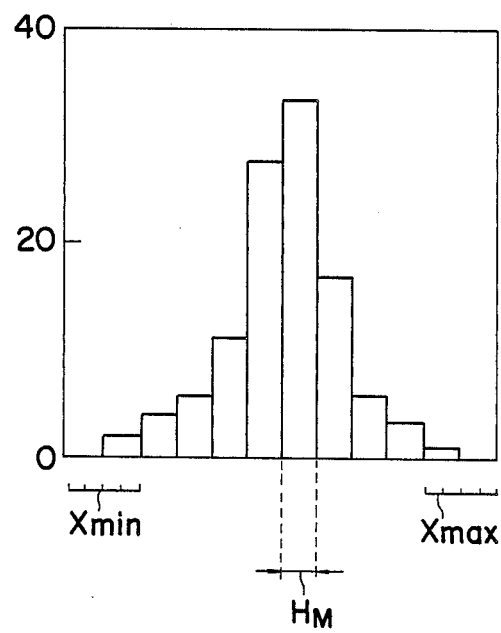
F I G. 20

METHOD AND DEVICE FOR MEASURING CHARACTERISTIC MAGNETIC DISTRIBUTION OF A MAGNETIC THIN FILM USING A MAGNETIC HEAD

BACKGROUND OF THE INVENTION

This invention relates to a high speed and efficient method for detecting magnetization characteristics of magnetic thin film used in magnetic recording media such as magnetic tapes, magnetic stripes of magnetic cards or magnetic discs, and to a measuring device thereof.

Along with the progress in the information society, magnetic recording media such as magnetic cards, magnetic tapes and magnetic discs have formed a considerably large market which is expected to further grow in the future. In order to stably manufacture these media in a large quantity at a low cost and improve product quality, further research and developing efforts are required. A measurement device for measuring magnetization characteristics of these media is one of the supporting means for such efforts. For example, a DC magnetization characteristic automatic recording system (Model 3257, Yokogawa Electric Corporation in Japan) and DC magnetized B-H characteristics automatic recording systems (Models BHS-40, BHH-50 and BHU-60, Riken Denshin Kabushiki Kaisha in Japan) are currently commercially available for recording the magnetization characteristics of magnetic films, such as the magnetic film on a magnetic tape.

As an example of detection by those systems, a detection method popularly used for magnetization characteristics on an annular sample will be described. When a magnetic material or an object of detection is charged with a magnetic field H, the density of the magnetic flux $\Phi$ generated on the material changes according to the intensity of the magnetic field H. When the magnetic field H is plotted on a horizontal axis, and the magnetic flux $\Phi$ on a vertical axis, a magnetization curve or a hysteresis loop is obtained. More specifically, as shown in FIG. 1, an anuular magnetic material 100 is wound with a magnetizing coil 101 (the number of windings designated $N_1$) on the primary side thereof and with a detection coil 102 (the number of windings designated $N_2$) on the secondary side thereof. The magnetization coil 101 is supplied with sine wave signal of a low frequency from a low frequency oscillator 103, and a resistance $R_1$ is inserted in series as shown.

Since the magnetic field H in the magnetic material 100 can be regarded as proportional to the electric current $I_1$ passing through the magnetizing coil 101, if the length of the magnetic path of the magnetic material 100 is denoted as l, the following relation holds:

$$H = \frac{N_1 I_1}{l} = \frac{N_1}{lR_1} \cdot V_1 \tag{1}$$

The generated magnetic flux $\Phi$ is obtained by integrating the output voltage $V_2$ of the detection coil 102. Namely, since the output voltage $V_c$ can be determined by equation (2) below.

$$V_c = \frac{1}{C \cdot R_2} \int V_2 dt = \frac{-N_2}{C \cdot R_2} \int \frac{d\phi}{dt} dt = \frac{-N_2}{C \cdot R_2} \cdot \phi \tag{2}$$

The following relation therefore holds as shown below as equation (3).

$$\phi = \frac{-C \cdot R_2}{N_2} \cdot V_c \tag{3}$$

A magnetization curve ($\Phi$—H curve) can be obtained by measuring the voltages $V_1$ and $V_c$. If the voltage $V_2$ is plotted on the vertical axis, the output proportional to magnetic permeability is obtained.

The magnetic material measurement system based on the above described principle is disclosed in "Yokogawa Giho" VOl. 17, No. 2, pp. 49-72, 1973. Although the measurement system is intended for universal use, as it is applicable to the measurement having a materials of high permeability such as plates or blocks of permanent magnets, magnetic powder, magnetic thin film, etc., the measurement system is still not entirely free of problems in performance, operability and price. Moreover, when used for measuring magnetic stripes prepared by thermal transfer or application on a paper card, a card or a passbook on which magnetic tapes are pasted, or a magnetic card coated on its surface in magnetization characteristics, a sample 110 of the magnetic thin films should be cut out from the card or book as shown in FIG. 2, adjusted in size to accommodate the size of the system, and sorted in a layer of about ten cards before being subjected to the actual measurement. The system therefore is extremely cumbersome. The measurement system, moreover, is incapable of measuring the magnetization characteristics of magnetic stripes on a magnetic card as incorporated on the card. It was heretofore extremely difficult to measure the absolute value of the magnetization characteristics of a magnetic stripe medium, a magnetic disc medium or the like.

A relation evaluation method for a standard medium is established as a compatibility standard by, for instance, JIS (Japanese Industrial Standard) No. B 9560-1979 and JIS No. 6291-1986. However, since these evaluation methods include the effect of the magnetic field from the magnetic head, the characteristic value of a particular medium per se cannot be clearly determined. The prior art method is further detrimental in that a user should visually read saturation magnetic flux, residual magnetism, holding force, and other magnetization characteristics from the hysteresis curve which is drawn on a sheet of paper with an X-Y recorder and calculate them in order to determine the quality of the magnetization characteristics, which is quite energy- and time-consuming. There is not yet developed no a system which can measure the distribution of the magnetization characteristics of a magnetic striped medium or that which can analyze the process capability of those magnetization characteristic values. If the above mentioned measurement system is used to measure plural points on the magnetic thin film of a magnetic head (single head type), a moving mechanism for the magnetic head or the medium becomes necessary.

There has been proposed a method for measuring by means of plural magnetic heads (multi-head type). For instance, the data on the first location on a magnetic thin film is read in the first period without switching the channel of the output voltage of a multi-head, and the data on the second location on the magnetic thin film is read in the next period. However, this method is detrimental in that it requires a long period of time for the measurement unless a high frequency wave is used as an excitation signal. However, if high frequency wave signal is used, an eddy current is generated on the medium per se at the time of measurement and affects the result. The system currently available in the market are extremely large sized because individual components such as an excitation device, an integrater for signal processing, a recorder, etc. are merely combined.

SUMMARY OF THE INVENTION

This invention was contrived to obviate aforementioned problems encountered in the prior art, and aims at providing a magnetization characteristic detection method and a measurement system thereof which can automatically and quickly measure the magnetization characteristic distribution of the magnetic thin film of such magnetic recording media as magnetic tapes, magnetic stripes and magnetic discs without physically destroying the objects by cutting out a sample from a magnetic tape or by deforming the same.

According to one aspect of this invention, for achieving the objects described above, there is provided a magnetization characteristic detection method for magnetic thin films which comprises the steps of applying a low frequency signal on a primary coil of a differential type magnetic head, changing a magnetic field using the low frequency signal when a magnetic thin film is in contact or in proximity with a gap of the differential type magnetic head, and calculating the magnetization characteristics of the magnetic thin film based on the differential output voltage from a secondary coil of the differential type magnetic head.

According to another aspect of this invention, there is provided a measurement device for magnetization characteristics of a magnetic thin film comprising a differential type magnetic head which linearly integrates plural magnetic cores and at least one cancellation core for simultaneously measuring plural location on the magnetic thin film, an excitation signal generating means which excites the differential magnetic head with repetitive signals, a measured data converting means which samples consecutively plural differential output voltages from the differential type magnetic head positioned on or near the target magnetic thin film and which converts the samples values into digital values, and a measured data analyzing means which consecutively stores the thus converted digital values from the conversion means, and calculates magnetization characteristics of the plural locations on the magnetic thin film.

The nature, principle and utility of the invention will become more apparent from the following detailed description when read in conjunction with the accompanying drawings.

BRIEF DESCRIPTION OF THE DRAWINGS

In the accompanying drawings:

FIG. 3 is a view to show a principle of a magnetization characteristics measurement according to this invention;

FIG. 4 is a view to show the relation between a magnetic head and a magnetic field;

FIGS. 5 and 6 are graphs to show examples of the magnetization characteristics;

FIGS. 7 through 11 are views to show other embodiments of the magnetic head in structure;

FIGS. 12 and 13 are block diagrams to show an embodiment of the magnetization characteristics measurement device according to this invention;

FIGS. 17A through 17E are timing charts to show signals at each section of the measured data converting section;

FIGS. 18 through 20 and 24 are examples of graphs displayed on a display, respectively:

DETAILED DESCRIPTION OF THE INVENTION

Figure 1:
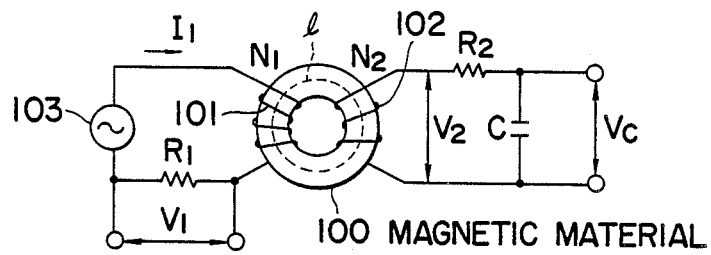
FIG. 1 is a view to explain detection methods of magnetization characteristics which are generally employed in the prior art.
Figure 2:
FIG. 2 is a view to explain the prior art detection of a magnetic thin film.

FIG. 3 shows a measurement principle on a structure of this invention method wherein a magnetic core 1, having the shape of a letter H and being horizontally and vertically symmetrical is wound with primary coils 2 and 3 each having a winding number $N_1$ and connected in series, and is wound with secondary coils 4 and 5 of the each having a winding number $N_2$. The primary coils 2, 3 and the primary coils 2, 3 the secondary coils 4, 5 are wound separately, and connected to an oscillator 6 which outputs a triangle wave signal of a low frequency in the range of 1–10 Hz. A gap 1A on the detecting side is provided beneath the magnetic core 1 while a gap 1B on the non-detecting side is provided above the magnetic core 1. An electric resistance r is interposed between the oscillator 6 and the primary coil 2, and the voltage drop $V_i$ across the resistance r is obtained via an amplifier 7. The output voltage $V_s$ from the secondary coil 4 is obtained via an amplifier 10, the output voltage $V_{sc}$ of the secondary coil 5 is obtained via an amplifier 11, and the output the output voltages $V_s$ and $V_{sc}$ are inputted to a differential amplifier 12. The gains at the amplifiers 10 and 11 and of the differential amplifier 12 are assumed to be "1" for convenience's sake in this embodiment, respectively. The cross sectional area of the magnetic core 1 at the coils is denoted as S, and at the gap 1A as $S_g$, the length of the core magnetic path as l, the gap length as $l_g$, the permeability of the magnetic core 1 as $\mu$, and the permeability of air as $\mu_o$.

The magnetic field generated on the gap 1A on the detecting side will be described first.

The magnetic flux $\Phi$ when no medium is contacted with the gap 1A is represented by the equation below wherein the magnetic reluctance of the magnetic core 1 is denoted as R ($=l/\mu S$), and the magnetic reluctance of the gap 1A as Rg ($=l_g/\mu_o S_g$).

$$\phi = \frac{N_1 I}{R + R_g} = \frac{N_1 I}{\frac{l}{\mu S} + \frac{l_g}{\mu_o S_g}} \tag{4}$$

The magnetic field $H_g$ of the gap 1A is represented as below.

$$H_g = \frac{\phi}{\mu_o S_g} = \frac{N_1 I}{\frac{\mu_o S_g}{\mu S} l + l_g} \tag{5}$$

If $(\mu_o S_g/\mu_s)l \ll l_g$, then the following relationship holds as shown in the equation (6).

$$H_g \approx \frac{N_1 I}{l_g} \tag{6}$$

Since $V_i = I \cdot r$, the relation between the magnetic field $H_g$ and the voltage $V_i$ is represented by the equation (7).

$$H_g = \frac{N_1}{l_g \cdot r} \cdot V_i \tag{7}$$

Due to the relation of $R \ll R_g$, the magnetic flux $\Phi$ at the gap 1A shows an extension as shown in FIG. 4 and a portion of the magnetic flux extends in parallel to the direction to the length of apparent gap $l_g$ in the magnetic thin film 20. If the magnetic thin film 20 is contacted with the gap 1A, and the magnetic flux at the time is denoted as $\Phi$, the electromotive voltage $V_s$ of the secondary coil 4 can be expressed by the equations (8) and (9) below.

$$V_s = -N_2 \frac{d\phi}{dt} \quad \text{(absence of medium)} \tag{8}$$

$$V_{s1} = -N_2 \frac{d\phi_1}{dt} \quad \text{(presence of medium)} \tag{9}$$

If the magnetic flux is denoted as $\Phi_c$, the electromotive voltage $V_{sc}$ of the secondary coil 5 on the non-detecting side is expressed as below.

$$V_{sc} = -N_2 \frac{d\phi_c}{dt} \tag{10}$$

Therefore, the output $V_D$ after differential by the differential amplifier 12 becomes as below when there is no magnetic thin film 20 present according to the equations (8) through (10).

$$V_D = V_s - V_{sc} = -N_2 \left( \frac{d\phi}{dt} - \frac{d\phi_c}{dt} \right) \tag{11}$$

$$= -N_2 \frac{d(\phi - \phi_c)}{dt}$$

and the output voltage $V_{D1}$ is expressed as below when the magnetic thin film 20 is present.

$$V_{D1} = V_{s1} - V_{sc} = -N_2 \left( \frac{d\phi_1}{dt} - \frac{d\phi_c}{dt} \right) \tag{12}$$

$$= -N_2 \frac{d(\phi_1 - \phi_c)}{dt}$$

Since the low frequency triangle wave signal is applied on the primary coils 2 and 3 from the oscillator 6, the magnetic flux $\Phi$ decreases or increases simply. When the outputs $V_D$ and $V_{D1}$ of the differential amplifier 12 is taken in a computer and synchronized by a charged magnetic field H calculating the difference between the equation (11) and the equation (12), the voltage $V_D'$ based on an increment of the magnetic flux $\Phi$ due to the presence of the magnetic thin film 20 can be calculated. There is no need to take in the differential output $V_D$ into a computer but simply $V_{D1}$ is regarded as $V_D'$ when the output from the differential amplifier 12 is substantially approximate to zero when there is not magnetic thin film 20 to allow a rough detection, and when the output $V_D$ becomes zero by enhancing the manufacture precision of the magnetic core 1.

$$V_D' = V_{D1} - V_D = -N_2 \left( \frac{d\phi_1}{dt} - \frac{d\phi}{dt} \right) \tag{13}$$

$$= -N_2 \frac{d(\phi_1 - \phi)}{dt}$$

If the cross sectional area of the magnetic thin film 20 is denoted as $S_1$ (= thickness $t \times$ width W), the magnetic flux density $B_1$ is expressed as equation (14).

$$\phi_1 - \phi = \phi' = B_1 \cdot S_1 \tag{14}$$

The equation (15) is derived from the equation (13).

$$V_D' = -N_2 \frac{d(B_1 S_1)}{dt} = -N_2 S_1 \frac{dB_1}{dH} \cdot \frac{dH}{dt} \tag{15}$$

The permeability $\mu_1$ of the magnetic thin film 20 can be represented by the equation (16). (More precisely, the magnetic susceptibility $\chi$, $\mu_1 = \chi = \mu_1' - 1$. The letter $\mu_1'$ denotes a true permeability).

$$\mu_1 = \frac{dB_1}{dH} = \frac{V_D'}{-NS_1 \cdot \frac{dH}{dt}} \tag{16}$$

By adding the data at each magnetic field intensity in equation (13), a software integration can be conducted. Namely, $$\Sigma(V_D' \cdot \Delta t) = -N_2 \int \frac{d\phi'}{dt} \cdot dt = -N_2 \cdot \Phi' \tag{17}$$

holds. And therefore, equation (18) is derived.

$$\Phi' = \frac{-\Delta t}{N_2} \cdot \Sigma V_D' \tag{18}$$

Wherein $\Delta t$ denotes a sampling period, and the addition is conducted for one period of the charged magnetic field H.

The above software integration will now be described in detail. The characteristic curve I in the graph shown in FIG. 5 represents the change v(H) of voltage $V_D'$ against the magnetic field H in the equation (13), and an arbitrary point on the characteristic I is expressed as $v_i$. The following integrated values $\psi$ will be obtained next by means of the data sampling period $\Delta H$ from the initial value $V_i$.

$$\left.\begin{array}{l} \psi_i = v_i \cdot \Delta H \\ \psi_{i+1} = \psi_i + v_{i+1} \cdot \Delta H \\ \psi_{i+2} = \psi_{i+1} + v_{i+2} \cdot \Delta H \\ \cdot \\ \cdot \\ \psi_{i+n} = \psi_{i+n-1} + v_{irn} \cdot \Delta H \\ = \sum_{k=0}^{n} v_{i+k} \cdot \Delta H \end{array}\right\} \quad (19)$$

Then the magnetic flux $\Phi_{i+n}$ can be calculated by correcting the above equation as follows.

$$\Phi_{i+n} = \sum_{k=0}^{n} v_{i+k} \cdot \Delta H - \tfrac{1}{2}(\psi_i + \psi_{i+a}) \quad (20)$$

Where, $\Phi_i$ and $\Phi_{i+a}$ are assumed to be the values symmetrical to the hysteresis loop. The value $\Phi_i$ is not necessarily an integration initial value so far as it is symmetrical from a central gravity. The magnetic flux $\Phi_{i+n}$ therefore becomes the integrated value against the horizontal axis H (magnetic field). This characteristic is denoted as curve II in FIG. 5. If characteristic curve I in FIG. 5 is integrated from $v_i$, the curve of the characteristic curve II can be obtained. The letter n in the equation is an integer counted from the initial value i for each sampling period $\Delta H$. The relation below holds if the equation (20) is related with the equation (18).

$$\Phi' = \Phi_{(H)} = \frac{-1}{N_2} \left\{ \Delta H \cdot \sum_{k=0}^{n} v_{i+k} - \tfrac{1}{2}(\psi_i + \psi_{i+a}) \right\} \quad (21)$$

FIG. 6 shows a magnetization curve (hysterisis loop) of thus obtained magnetic field H and the magnetic flux $\Phi'$ wherein the characteristic curve II is shifted in the downward direction of the vertical axis.

The winding of the primary and secondary coils on the magnetic core is by no means limited to those shown in FIG. 3, but may be of the structure where a magnetic core 1 of FIG. 3 is bent at the center of the vertical axis or of the horizontal axis or of the structure shown in FIG. 7 wherein the primary coil 30 is wound on a connection arm 1C of the magnetic core 1. As shown in FIG. 8, both arms of the magnetic core 1 may be wound not only with the primary coils 31 through 34 in series but also with the secondary coil upon the primary coils 31 and 34. Alternatively, the magnetic core may be divided into cores 40 and 41, shielded from each other with a shield material 42 as shown in FIG. 9. The magnetic core 40 may be wound with the primary coil 43 and the secondary coil 44 while the magnetic core 41 is wound with the primary coil 45 and the secondary coil 46. As shown in FIG. 10, the magnetic cores 50 and 51 may be completely divided, and wound with the primary and secondary coils respectively. Although the low frequency triangle wave signal is applied on the primary coil in as described above, it may be a sine wave signal. Integration of differential output voltage $V_{DL}$ may be made by an integration circuit of C·R instead of the above mentioned software integration. If the differential output voltage $V_D$ without the magnetic thin film 20 cannot be ignored, the precision may be improved by taking the integrated value of the differential output voltage $V_{DL}$ with the magnetic thin film 20 and the integrated value of the differential output voltage $V_D$ without the magnetic thin film 20 with in a computer, synchronizing by an applied magnetic field, and obtaining the difference therebetween.

Figure 11:
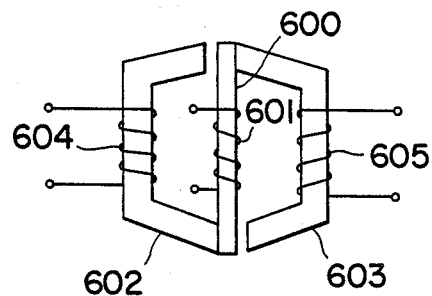

The shape and winding of the magnetic core and of the primary and secondary coils may be those shown in FIG. 11. In other words, a primary coil 601 is wound on a magnetic core 600, and secondary coils 604 and 605 are wound on magnetic cores 602 and 603 connected to the core 600 on both sides thereof in the form of an inverted letter U.

Description will now be given to a magnetization characteristic measurement device employing the magnetic characteristic detection method according to this invention.

Figure 12:
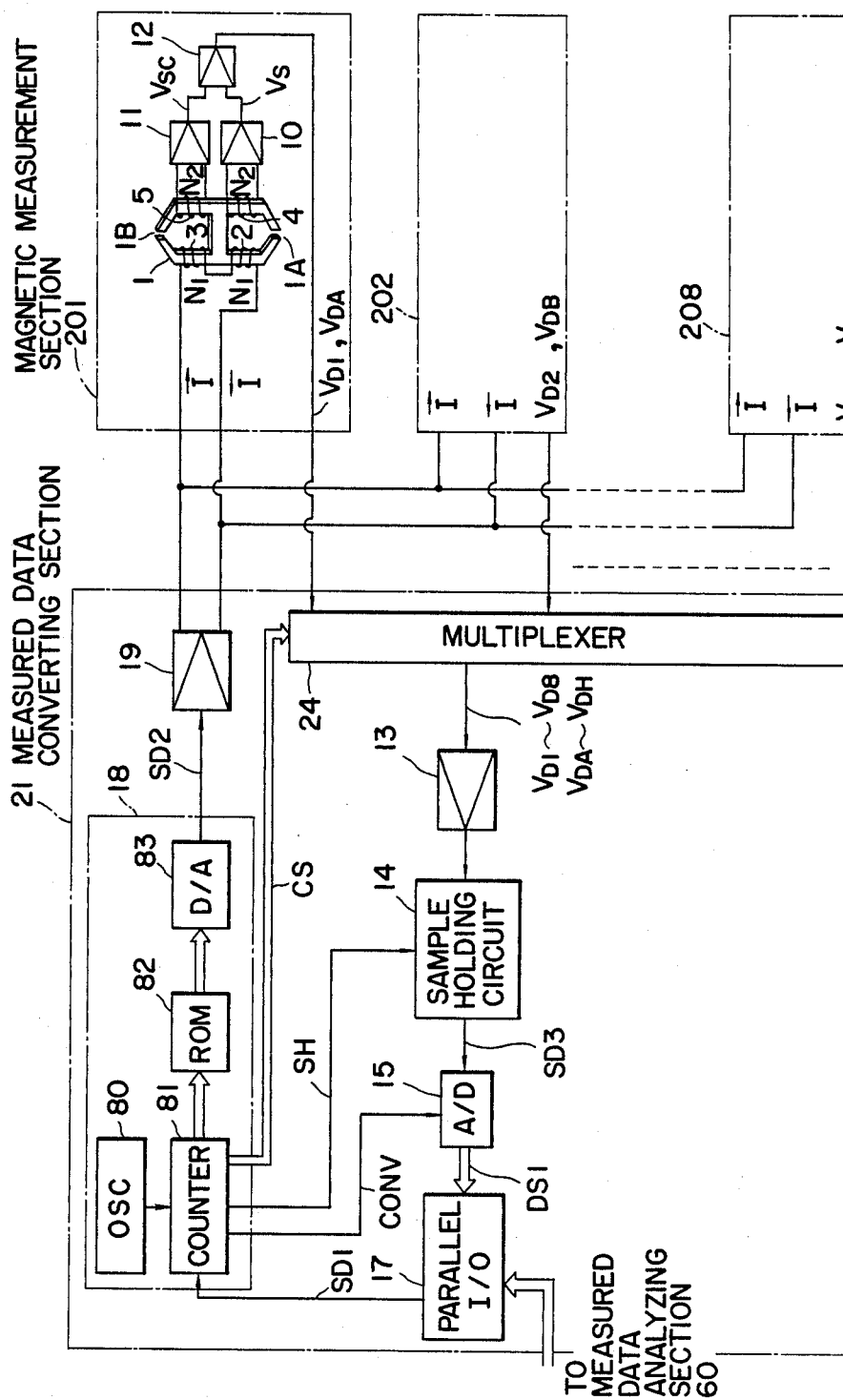

FIGS. 12 and 13 are block diagrams showing the circuit system of this invention magnetization characteristic measurement device (hereinafter referred to simply as the measurement device), which comprises plural (8 in this embodiment) magnetic measurement sections 201 through 208 which measures magnetization characteristic of the magnetic thin film on such recording media as a magnetic tape, a measured data converting section 21 which converts the voltage signals $V_{D1} \sim V_{D8}$ measured by the magnetic measurement sections 201 through 208 into digital signals and which issues triangle wave signals SD2 for driving the sections 201 through 208, and the measured data analyzing section 60 which has functions to process digital signals from the converting section 21 by a computer for displaying the magnetization characteristics, to analyze thus obtained magnetization characteristics, and to conduct self-diagnosis.

Respective sections will now be explained in more detail.

Figure 14:
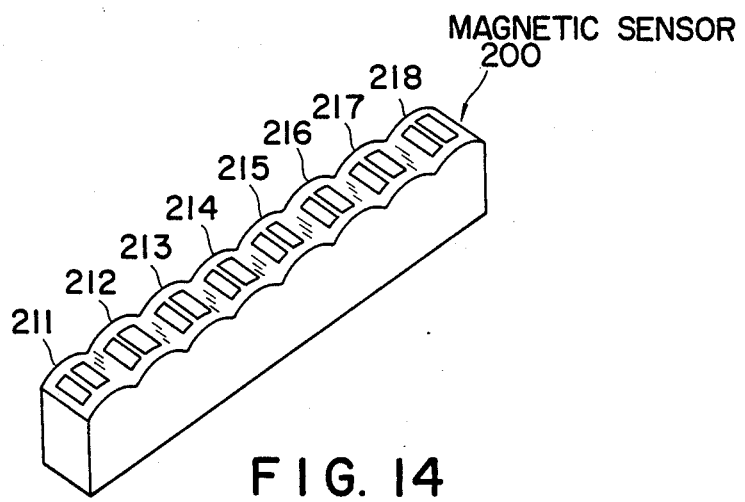
FIG. 14 is a perspective view of a magnetic sensor used as a differential type magnetic head.
Figure 15:
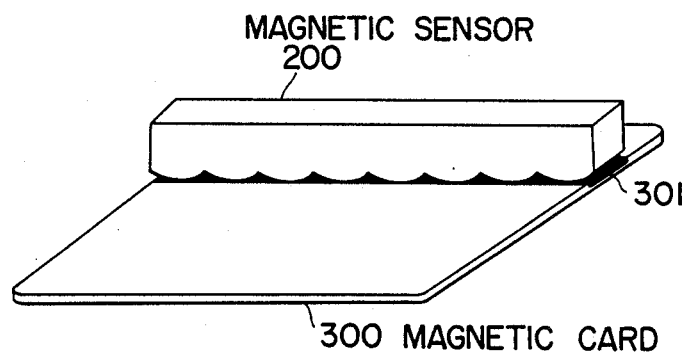
FIG. 15 is a perspective view to show how to use the magnetic sensor.

The magnetic measurement sections 201 through 208 are structured identically to each other wherein each section has a magnetic head 1 shaped like a letter H, and being vertically and horizontally symmetric, comprising a magnetic core and a cancellation core integrally combined. The respective magnetic heads 1 of the measurement sections 201 through 208 are provided in magnetic head sections 211 through 218 of a linear type multi-head type magnetic sensor 200 as shown in FIG. 14. The multi-head type magnetic sensor 200 comprises a differential type magnetic head. This multi-head type magnetic sensor 200 can detect magnetization characteristics on magnetic stripes magnetic thin film 301 on a magnetic card 300 as shown in FIG. 15 at eight positions simultaneously. Since the magnetic measurement sections 201 through 208 have the identical structure, explanation will be given only to the section 201. A magnetic core of the magnetic head 1 is wound with primary coils 2 and 3 each having a winding number $N_1$ which are series connected, and with secondary coils 4 and 5 each having the a winding number of $N_2$ wound separately. The primary coils 2 and 3 are inputted with a triangle wave signal SD2 of a low frequency in the range of 1 through 10 Hz by the measured data converting section 21 via an amplifier 19. On the lower portion of the magnetic core 1 is provided a gap 1A on the detecting side while on the upper portion of the magnetic core 1 is provided a gap 1B on the non-detecting side. The output voltage $V_s$ from the secondary coil 4 is obtained via an amplifier 10 while the output voltage $V_{sc}$ from the secondary coil 5 is obtained via an amplifier 11. The output voltages $V_s$ and $V_{sc}$ are inputted to a differential amplifier 12. The gains of the amplifiers 10 and 11 and of the differential amplifier 1 are assumed to be "1" for convenience's sake.

The measurement principle of the magnetic head 1 can be calculated in a manner similar to those employed in the above detection method equations (4) through (11). The magnetic flux $\Phi$ simply increases/decreases as the triangle wave signal SD2 of a low frequency is applied from the measured data converting section 21 on the primary coils 2 and 3. The output voltages $V_{DA}$ and $V_{D1}$ of the differential amplifier 12 are converted to digital signals by the converting section 21, taken in the measured data analyzing section 60, stored in RAMs 62 and 63 of a memory 61, and synchronized in an applied magnetic field H. Data are read out from the RAMs 62 and 63 to calculate the difference between the equations (10) and (11), to thereby calculate the output voltage $V_D'$ based on an increment in the magnetic flux $\Phi$ due to the presence of the magnetic thin film 20. When the output voltage $V_{DA}$ of the differential amplifier 12 without the magnetic thin film 20 is approximately zero, and a rough detection is permissible, or when the manufacturing precision of the magnetic cores 1 is improved to effect the output voltage $V_{DA}$ at value zero (by making the characteristics on the cancellation side and the detecting side completely agree to each other or $V_s = V_{sc}$), it is not necessary to take in the differential output voltage $V_{DA}$ in the measured data analyzing section 60, and therefore the voltage $V_{D1}$ can be treated as $V_{DA}'$.

$$V_{DA}' = V_{D1} - V_{DA} = -N_2 \left( \frac{d\phi_1}{dt} - \frac{d\phi}{dt} \right) = -N_2 \frac{d(\phi_1 - \phi)}{dt} \quad (22)$$

If the cross sectional area of the magnetic thin film 20 is denoted as $S_1$ (=thickness d×width W), the magnetic flux density $B_1$ on this location can be expressed as follows.

$$\Phi_1 - \Phi = \Phi' = B_1 \cdot S_1 \quad (23)$$

The equation below is derived from the equation (12).

$$V_{DA}' = -N_2 \frac{d(B_1 S_1)}{dt} = -N_2 S_1 \frac{dB_1}{dH} \cdot \frac{dH}{dt} \quad (24)$$

The permeability $\mu_1$ of the magnetic thin film 20 can be represented by the equation (25).

$$\mu_1 = \frac{dB_1}{dH} = \frac{V_{DA}}{-NS_1 \cdot \frac{dH}{dt}} \quad (25)$$

Integration is made with software in a manner similar to the above by adding data at the each magnetic field intensity by the equation (22) as follows. Since the relation below holds, the equation (27) is established in a similar manner to the equation (18).

$$\Sigma(V_{DA}' \cdot \Delta t) = -N_2 \int \frac{d\Phi'}{dt} \cdot dt = -N_2 \cdot \Phi' \quad (26)$$

$$\Phi' = \frac{-\Delta t}{N_2} \cdot \Sigma V_{DA}' \quad (27)$$

The measured data converting section 21 will now be described.

The measured data converting section 21 is provided with a parallel input/output interface 17 for communicating data with the measured data analyzing section 60. The control signals from the interface 17 are inputted to a triangle wave generator 18, and a generated triangle wave signal SD2 is inputted to the magnetic measurement sections 201 through 208 via an amplifier 19. The triangle wave generator 18 comprises a clock pulse oscillator 80, a counter 81 which starts counting the clock pulses with the control signal SD1, a ROM 82 which stores respective digital data for triangle wave generation at addresses corresponding to the counted signal from the counter 81, and a D/A converter 83 which converts digital data read out from predetermined addresses of the ROM 82 into analogue signals to prepare the triangle wave signal SD2. A multiplexer 24 is further provided in order to take in voltages $V_{D1} \sim V_{D8}$ (when a magnetic thin film is present) and voltage $V_{DA} \sim V_{DH}$ (when the magnetic thin film is not present) by successive switching. The multiplexer 24 is driven by switching signals from the counter 81. The voltages $V_{D1} \sim V_{D8}$ and $V_{DA} \sim V_{DH}$ which are consecutively outputted from the multiplexer 24 are amplified via an amplifier 13 respectively and are inputted to a sample holding circuit 14. The sample holding circuit 14 samples the above voltages $V_{D1} \sim V_{D8}$ and $V_{DA} \sim V_{DH}$ with timing signals SH from the counter 81 in the triangle wave generator 18, and inputs the sampling data SD3 to an A/D converter 15. The A/D converter 15 converts the sampling data SD3 into digital signals DS1 with conversion start signals CONV from the counter 81 in the generator 18, and transmits the signals to the measured data analyzing section 60 via the I/O interface 17.

Explanation will now be given to the measured data analyzing section 60.

The analyzing section 60 comprises a CPU 73 which reads out data from the RAMs 62 and 63 in the memory 61 and operates the software integration, a ROM 69 which stores a control program and so on, a RAM 62 which stores the differential output voltage data of the magnetic head 1 when a magnetic thin film 301 is placed on the magnetic head 1, a RAM 63 which stores the differential output voltage data of the magnetic head 1 when no magnetic thin film 301 is placed, and a memory 61 which stores other input data. It is further provided with a clock circuit 64 for displaying data or time on a display 68, a GP-IB interface 22, and a parallel input/output interface 70. The GP-IB interface 22 is connected to a GP-IB output connector 23 while the parallel input/output interface 70 is provided with a buzzer 72 which sounds acceptance of the magnetization characteristics, and an output connector 71 for a printer which outputs the magnetization characteristics to the printer. As a controller it is further provided with a controller 67 for driving a display 68, and a key controller 28 which controls input data from a keyboard 29. The controller 67 is operatively connected to video RAMs 65 and 66 which store images for the amount equivalent to two frames.

Figure 16:
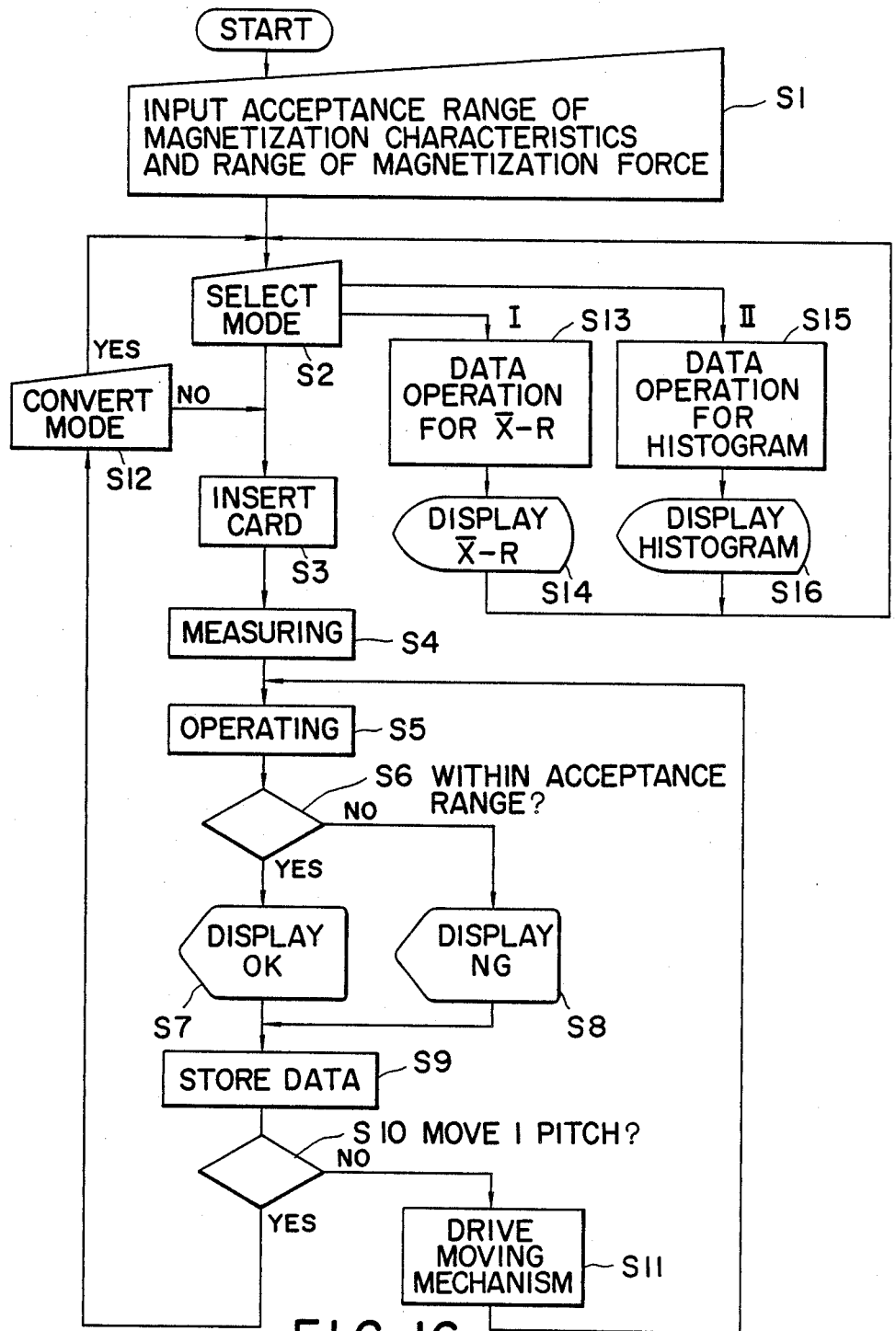
FIG. 16 is a flow chart to show an example of operation of the magnetization characteristic measurement device.

Operation of the measurement system is described below referring to the flow chart in FIG. 16.

Figure 18:
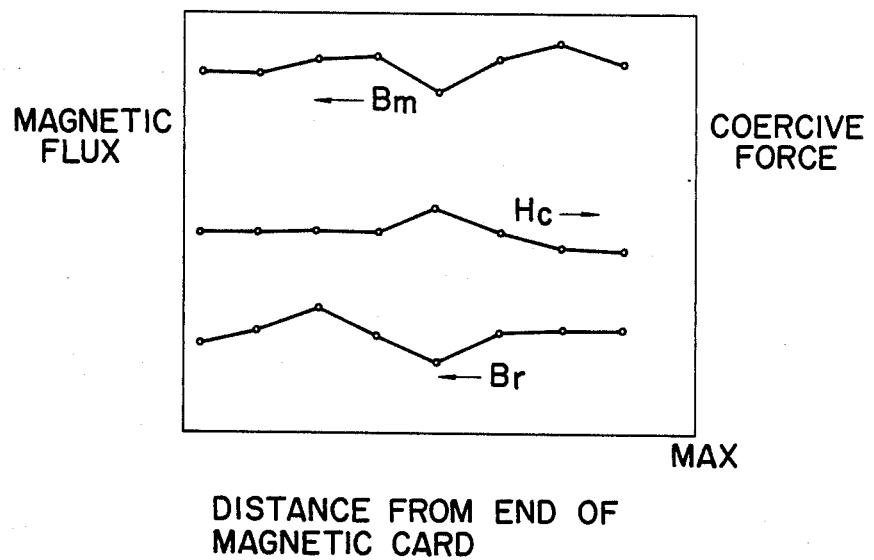

After the power source switch is turned on, and the acceptance range of the magnetization characteristics of the magnetic thin film 301 which is the object of measurement and the range of magnetization force (e.g. 1000 [$O_e$] ~10,000 [$O_e$] in ten steps) are inputted using the ten keys on the keyboard 29 (Step S1). This inputted acceptance range data are stored in the memory 61 of the measured data analyzing section 60. The acceptance scope data comprises upper and lower limits of saturated magnetic flux Φm (saturated magnetic flux density $B_m$), residual magnetic flux Φr (residual magnetic flux density $B_r$), coercive force $H_c$, rectangular ratio D (=$Φ_r/Φ_m$=$B_r/B_m$). Modes are selected from the keyboard 29 (Step S2). When a measurement mode is selected, the target magnetic card 300 is inserted in a table (not shown) of the measurement device, and the magnetic thin film of the magnetic stripes 301 thereof is positioned on a marker (Step S3). The position of the magnetic thin film 301 which should be measured is confirmed as not deviating, and then the key is manipulated. The magnetic sensor 200 is positioned on the magnetic thin film 301 of the magnetic card 300 as shown in FIG. 15, and when control signals are sent from the measured data analyzing section 60 to the converting section 21, the measurement of the magnetization characteristics is started (Step S4). With the control signal SD1, the counter 81 starts counting-up, and the triangle wave signal SD2 which is generated by converting in D/A converter 83 the digital data stored in advance at the address within the ROM 82 corresponding to the counter signal are applied on the primary coils 2 and 3 of each magnetic head 1 of the magnetic measurement sections 201 through 208 via the amplifier 19 to generate the magnetic field H between the gap 1A and the gap 1B of each magnetic head 1. The secondary coils 4 and 5 generate the electric voltages in proportion to the chronological changes in magnetic flux passing through the magnetic core 1, and voltage signals $V_{D1}$~$V_{DS}$ are obtained via the amplifiers 10, 11 and the differential amplifier 12, and consecutively selected by the multiplexer 24 in the converting section 21 to be inputted to the sample holding circuit 14. The sampling data SD3 is converted into digital signals DS1 by the A/D converter 15 and inputted to the measured data analyzing section 60 via the parallel input/output interface 17. The graph in FIG. 17A shows the waveform of the counting pulses generated from the clock pulse oscillator 80, the graph in FIG. 17B shows the triangle wave signal SD2 generated from the D/A converter 83 in correspondence to the counting pulses, the graph in FIG. 17C shows the state of channel selection by the multiplexer 24, the graph in FIG. 17D shows sample holding signals SH inputted to the sample holding circuit 14, and the graph shown in FIG. 17E is a timing chart of the conversion start signal inputted to the A/D converter 15. In short, the counter 81 drives the ROM 82 based on the clock pulses oscillated as in FIG. 17A to generate the triangle wave signal SD2 shown in FIG. 17B from the D/A converter 83. Every time a certain number of, for instance "8", clock pulses are counted, the switching signal CS is inputted to the multiplexer 24 to switch the channel of the multiplexer 24 as shown in FIG. 17C (CH1→CH2). After switching, the sample holding signals SH which are extended by the length equivalent to, for example, one clock pulse is inputted from the counter 81 to the sample holding circuit 14 (as shown in FIG. 17D). Any one of the voltage signals $V_{D1}$ through $V_{D8}$ which have been inputted to the sample holding circuit 14 form the multiplexer 24 via the amplifier 13 is sample-held. The A/D converter 15 is inputted with an A/D start signal CONV which is delayed by one pulse as shown in FIG. 17E and the sampling data SD3 which is sample-held is converted from analog to digital. When all the voltage signals $V_{D1}$ through $V_{D8}$ are stored in the RAM 62 for every predetermined time for one period of the triangle wave signal, the magnetic sensor 200 is removed from the magnetic thin film 301. In a similar manner, the voltage signals $V_{DA}$ through $V_{DH}$ are stored in the RAM 63 for every predetermined time for one period of the triangle wave signal. Then, signals corresponding to the RAMs 62 and 63 are subtracted. The hysteresis curve and the magnetization characteristics $Φ_r$($B_r$), $Φ_m$ ($B_m$), $H_C$, and D are stored in the memory 61 as measured values (Step S5). The CPU 73 compares the above measured values with pre-set reference values indicating the scope of acceptance, and displays on the display 68 the result by the terms such as "OK" or "NG" as well as the measured data, the hysteresis curve and so on. The distribution characteristics are displayed on the display 68 as shown in FIG. 18 based on the measurement results and stored in the video RAMs 65 and 66 via the controller 67. The buzzer 72 is actuated via the parallel input/output interface 70 and when it is displayed "OK", the buzzer 72 issues continuous BEEP sound (Steps S6 and S7). When it is displayed "NG" on the display 68, it issues an intermittent sound like Bip, Bip, . . . . . . (Steps S6 and S8). By executing the aforementioned processes, this device can obtain the magnetization characteristics of eight locations on the magnetic stripe 301 simultaneously with the magnetic heads 211 through 218 of the magnetic sensor 200, and the magnetic characteristics are stored in the memory 61 (Step S9). The memory 61 has a capacity for one hundred data sets within the RAM, and data are chronologically and successively logged together with the measurement time data from the clock circuit 64 therein.

This invention measurement device can further measure the magnetization characteristics of the magnetic stripe 301 in entirety by the following steps. More particularly, the magnetic sensor 200 or the magnetic card 300 is displaced by a predetermined length or equivalent to pitches of the magnetic heads 211 through 218 from the detection position shown in FIG. 15 (Step S11) to repeatedly measure at the eight locations to cover the entirety of the magnetic stripes 301. However, it is not always necessary to measure the entire stripes by one-pitch displacement if and when sampling of eight locations suffices.

When the mode switching is not designated by the key input, the measurement device should wait for the next measurement. After measurement of several magnetic cards, and the data processing mode I is selected by key input (Steps S12 and S2), the CPU 73 calculates the logging data in the memory 61, and displays x̄-R control diagram of the particular magnetization characteristics selected as FIGS. 19A and 19B (for instance, $Φ_r$ at the locations measured by the magnetic head 211) on the display 68 (Step S14). The x̄-R control diagram is prepared as follows. The total number N of data, size n of the groups and number k of the groups are determined as prerequisites. The total number N is determined by automatically counting the data in the memory 61, the size n is determined by the input by the user (n=3, 4 or 5), the number k is the quantinent obtained by $k=N/n$, and the resultant fraction is not used. For instance, if N=98 and n=3, the number k becomes "32" and the data after the 97th data are not used. The average $\bar{x}$ of a group can be obtained by the equation 28.

$$\bar{x}_j = \frac{1}{n} \sum_{i=1}^{n} x_i \qquad (28)$$

The grand average $\bar{\bar{x}}$ of the average $\bar{x}$ for respective groups is obtained by the equation (29).

$$\bar{\bar{x}} = \frac{1}{k} \sum_{j=1}^{k} \bar{x}_j \qquad (29)$$

The upper and lower critical lines UCL and LCL are expressed as below.

$$UCL = \bar{\bar{x}} + A_2 \bar{R} \qquad (30)$$

$$LCL = \bar{\bar{x}} - A_2 \bar{R} \qquad (31)$$

Where, $A_2$ and $D_4$ are obtained from the table 1.

TABLE 1

| n | $A_2$ | $D_4$ |
|---|-------|-------|
| 3 | 1.02  | 2.58  |
| 4 | 0.729 | 2.28  |
| 5 | 0.577 | 2.12  |

If these data are plotted in a graph, it becomes as that shown in FIG. 19A wherein the horizontal axis calibrates the number of groups. If n=3, and the axis calibrates by "5" until "33", when n=4 and n=5, the calibration will be set by "5" until "25". The vertical axis displays $\bar{x}$ wherein a limited number of dots are fixed for the length between LCL and UCL and numerical values denote LCL, CL and UCL. The fluctuation R in a group can be determined by the equation (32).

$$R_j = x_{max} - x_{min} \qquad (32)$$

The grand average R of the fluctuations R of all the groups can be determined by the equation (33).

$$\bar{R} = \frac{1}{k} \sum_{j=1}^{k} R_j \qquad (33)$$

The upper and lower control critical line UCL is determined by the equation (34).

$$UCL = D_4 \bar{R} \qquad (34)$$

The coefficient $D_4$ is obtained from the table 1. FIG. 19B shows the graph of aforementioned data.

When a data processing mode II is selected by key input (Step S2), the CPU 73 calculates the logging data in the memory 61 (Step S15) and displays the particular histogram of the selected magnetization characteristics on the display 68 (e.g. $\Phi_r$ at the location measured by the magnetic head 211) (Step S16). As a prerequisite, the maximum class number should be set at "10" on the horizontal axis and the ranges on the vertical axis should be automatically set at three values of "80", "40" and "20". Moreover, the calibration on the horizontal axis should display the values of $x_{max}$ and $x_{min}$. The number of the class k for the classification is set as shown in the equation (35).

$$k \approx \sqrt{N} \qquad (35)$$

The step width $H_M$, average $\bar{X}$ and standard deviation $\sigma$ are calculated by the equations (36), (37) and (38).

$$H_M = \frac{X_{man} - X_{min}}{k} \qquad (36)$$

$$\bar{X} = \frac{1}{N} \sum_{i=1}^{N} X_i \qquad (37)$$

$$\sigma = \sqrt{\frac{1}{N} \sum_{i=1}^{N} (\bar{X}_i - X)^2} \qquad (38)$$

When data are substituted in the aforementioned equations (35) through (38) to plot them in a graph, the graph shown in FIG. 20 is obtained.

Figure 21:
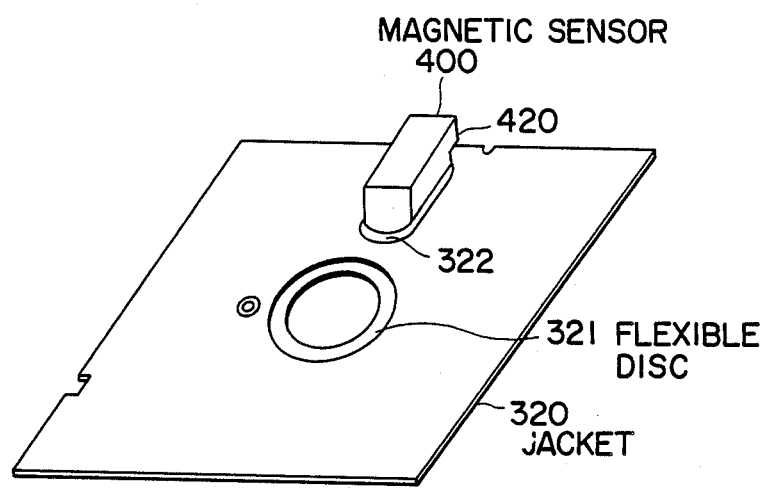
FIGS. 21 and 25 are perspective views to show how to use the magnetic sensors shown in FIGS. 22 and 26, respectively.
Figure 22:
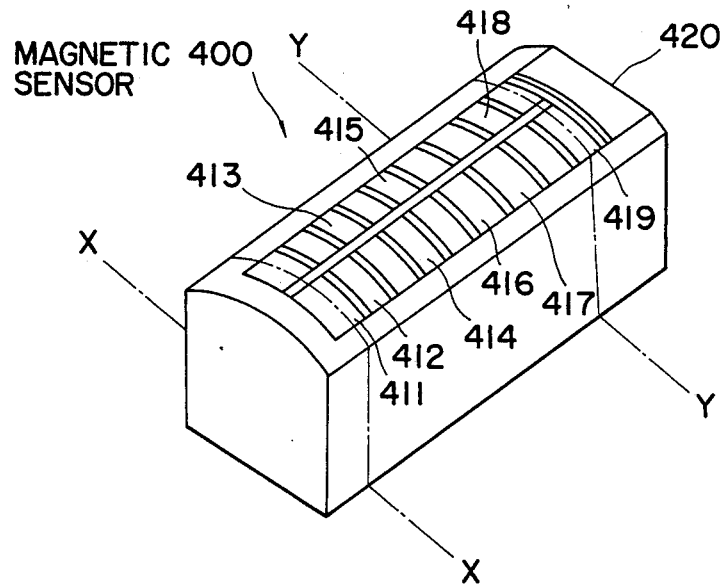
FIGS. 22 and 26 are views to show other embodiments of the magnetic sensors used as a differential type magnetic head, respectively.

Although in the foregoing embodiment, the mangetic stripe 301 on the magnetic card 300 in described as the object of detection, the magnetization characteristics of a disc surface of a flexible disc can be measured by using the magnetic sensor 400 as the differential type magnetic head as shown in FIG. 22. More particularly, FIG. 21 shows the state of detection on the magnetic thin film of a flexible disc 321 wherein a magnetic sensor 400 is approached to a head window 322 of a jacket 320 which houses a flexible disc 321 to measure magnetization characteristics on the disc surface.

Figure 23A:
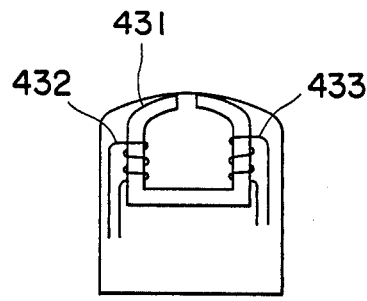
FIG. 23A is a sectional view to show a head portion shown in FIGS. 22 and 26 in a cross section along the line X—X.
Figure 23B:
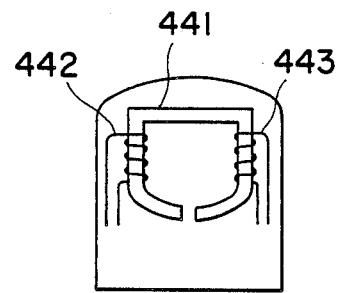
FIG. 23B is a sectional view to show a head portion shown in FIGS. 22 and 26 in a cross section along the line Y—Y.
Figure 24:
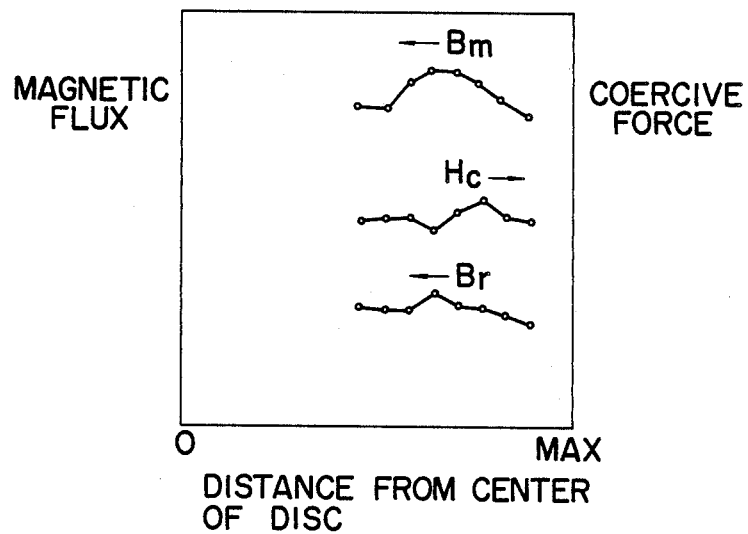

FIG. 22 shows the structure of the magnetic sensor 400 perspectively wherein magnetic head section 411 through 419 of a multi-channel device for detecting magnetization characteristics, and inside the magnetic head sections 411 through 418 are housed magnetic heads each comprising a magnetic core 431 would with a primary coil 432 and a secondary coil 433 as shown in FIG. 23A. A cancellation core 441 wound with a primary coil 442 and a secondary coil 443 is provided as shown in FIG. 23B which is a cross sectional view along the line Y—Y in FIG. 22. Magnetic heads of the magnetic sections 411 through 418 correspond to the magnetic head detecting side of the aforementioned magnetic sensor 200 while the magnetic sensor 200 of the magnetic head section 419 corresponds to the non-detecting side of the magnetic head. More specifically, the magnetic head detecting side of the aforementioned magnetic measurement sections 201 through 208 are respectively provided at the magnetic head sections 411 through 418 in this magnetic sensory 400, and the magnetic head section 419 doubles as the magnetic head non-detecting side. On the end surface of a case on the side of the magnetic head section 419 of the magnetic sensor 400 is provided a notch 420 in order to prevent interference between the ends of the jacket 320 and the end surface of the sensory 400.

Figure 25:
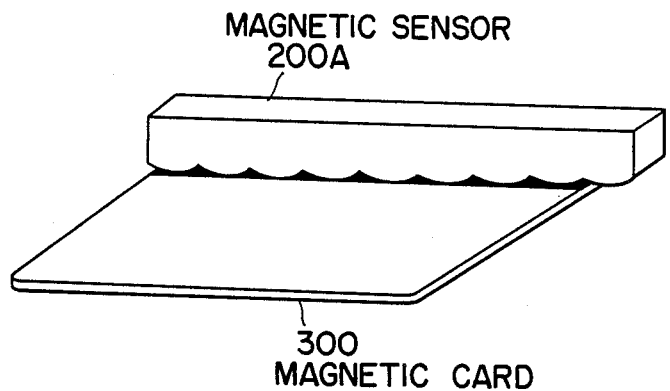
Figure 26:
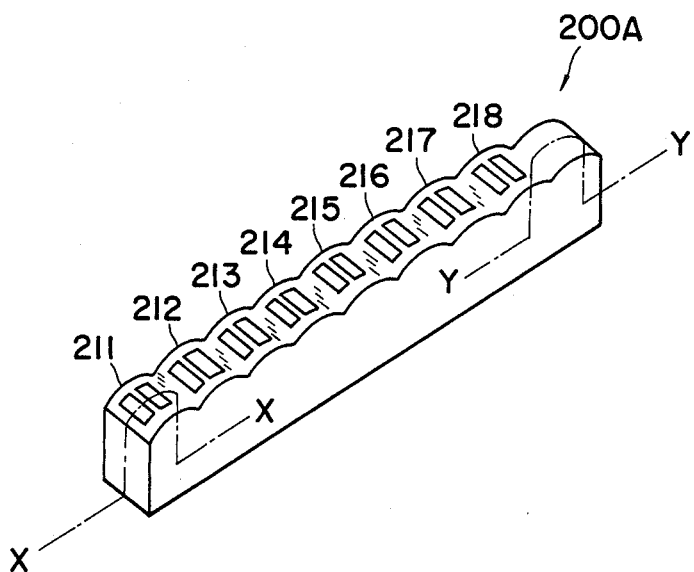

By means of the magnetic sensor 400 of the aforementioned structure, the magnetization characteristics of the flexible disc 321 can be measured at the eight locations linearly and simultaneously with the block structure substantially similar to that of the aforementioned embodiment. However, in this embodiment, the magnetic core and the cancellation core are not integrally structured so that the output of the cancellation head 419 and the outputs from the magnetic heads 411 through 418 separately inputted to the differential amplifier to be differential-amplified, consecutively switched by the multiplexer 24, converted into digitial signals and stored in a memory. In other words, the use of the output from the cancellation head 419 is shared. The distribution characteristics of the measurement results is displayed on the display 68 as shown in FIG. 15. By rotating the flexible disc 321 by a predetermined angle, the magnetization characteristics on the whole surface can be measured. FIGS 25 and 26 shown an application of such a principle or separation of the magnetic core from the cancellation core as in the embodiment above. The cross section along the line X—X and that along the line Y—Y in FIG. 26 correspond respectively to FIG. 23A and FIG. 23B.

The winding of the primary and the secondary coils on the core of the magnetic head 1 used in this invention is not limited to those shown in FIGS. 3 and 23A and 23B, but may be the structures shown in FIGS. 7 through 11. The triangle wave signal of the low frequency is applied on the primary coil in the foregoing statement, but it may be sine wave or other wave signals. Magnetic cards and flexible discs are the objects of measurement in the above statement, but this invention measurement device can be applied to the magnetic tapes, discs and optical/magnetic discs. The aforementioned magnetic sensor has an eight channelled magnetic head in structure, but the number of channel is arbitrarily chosen. In another embodiment shown in FIG. 22, the position of the cancellation head 419 is not limited to the one near the notch 420.

As is described in the foregoing statement, this invention method is extremely simple in operation as the intended effect is achieved simply by causing a magnetic thin film to contact with or to approach the gap of a differential type magnetic head. If integration method with software is employed for obtaining Φ-H curve, errors due to drifts are eliminated to thereby attain highly precise results. Moreover, the magnetic thin film does not have to a be processed to predetermined size in advance.

This invention magnetization characteristic measurement device enables measurement of the distribution of magnetization characteristics of a magnetic thin film by one measurement (plural point rapid measurement) simply by placing a magnetic print, a magnetic tape, a flexible disc, a magnetic disc, a magnetic card, etc. on an appropriate position of the system. Since this invention system can display the result of judgement in the magnetization characteristics via the screen of a display or sound of a buzzer, it can advantageously reduce the number of inspection steps. Moreover, since this invention method employs a channel switching method for magnetic heads, it can excite a magnetic thin film with repeated signals of a low frequency to thereby minimize the effect of eddy current on the inspection target. This invention can directly measure an object in non-destructive manner, enables measurement of absolute values in the test of magnetization characteristics of magnetic stripes and disc media, and to thereby clarify the reference in evaluation of compatibility of a medium. If a transportation mechanism and a rotational device such as a stepping motor is added to the system, it can measure distribution of the magnetization characteristics over the stripe of a disc surface in its entirety, display the quality thereof in accordance to a predetermined reference, and easily standardize common quality standards.

It should be understood that many modifications and adaptations of this invention will become apparent to those skilled in the art and it is intended that such obvious modifications and changes be encompassed in the scope of the claims appended hereto.

What is claimed is:

1. A magnetization characteristic detection method for magnetic thin films which comprises the steps of:
    applying a low frequency signal on a primary coil of a differential type magnetic head;
    changing a magnetic field with said low frequency when a magnetic thin film is in contact or in proximity with a gap of said differential type magnetic head;
    calculating magnetization characteristics of said magnetic thin film based on a differential output voltage from a secondary coil of said differential type magnetic head, wherein said calculating step includes detecting differential output voltages $V_D$ and $V_{D1}$, said differential output voltage $V_D$ being a voltage output from the secondary coil when the magnetic film is in contact with or in proximity to the gap, said differential voltage $V_{D1}$ being a voltage output from the secondary coil when the magnetic thin film is neither in contact with nor in proximity to the gap; and
    calculating a different voltage $V_D'$ by subtracting the voltage $V_D$ from the voltage $V_{D1}$.

2. A magnetization characteristic detection method as claimed in claim 1 wherein the frequency of said low frequency signal is in the range of 1–10 Hz.

3. A magnetization characteristic detection method as claimed in claim 1 wherein said low frequency signal is triangle wave.

4. A magnetization characteristic detection method as claimed in claim 1, further including the step of calculating a magnetic flux $\Phi'$ according to the following equations:

$$\Sigma(V_D' \cdot \Delta t) = -N_2 \frac{d\Phi'}{dt} \cdot dt = -N_2 \cdot \Phi'$$

and $$\Phi' = \frac{-\Delta t}{N_2} \cdot \Sigma V_D'$$

wherein $\Delta t$ denotes a sampling period, and $N_2$ is a winding number of the secondary coil.

5. A magnetization characteristic detection method as claimed in claim 4 including the step of obtaining a magnetization curve in relation to a magnetic field H and the magnetic flux $\Phi'$.

6. A measurement device for measuring magnetization characteristics of a magnetic thin film comprising:
    a differential type magnetic head having plural magnetic cores and at least one cancellation core for simultaneously measuring plural locations on the magnetic thin film;
    an excitation signal generating means for exciting the differential magnetic head with repetitive signals;
    a measured data converting means for consecutively sampling plural differential output voltages from the differential type magnetic head, said differential type magnetic head being positioned on or near the magnetic thin film, and for converting the thus sampled values into digital values; and a measured data analyzing means for consecutively storing the thus converted digital values from the measured data converting means, and for calculating magnetization characteristics of said plural locations on the magnetic thin film said measured data analyzing means including means for detecting differential output voltages $V_D$ and $V_{D1}$, said differential output voltage $V_D$ being a voltage output from the secondary coil when the magnetic film is in contact with or in proximity to the gap, said differential voltage $V_{D1}$ being a voltage output from the secondary coil when the magnetic thin film is neither in contact with nor in proximity to the gap, and further including means for calculating a difference voltage $V_D'$ by subtracting the voltage $V_D$ from the voltage $V_{D1}$.

7. A magnetization characteristic measurement device as claimed in claim 6, wherein each of said magnetic cores is structured in a shape of a letter H having two vertical side arms and one horizontal connecting arm, and which is horizontally and vertically symmetrical.

8. A magnetization characteristic measurement device as claimed in claim 7, further comprising primary coils wound in series on one vertical side arms of said magnetic cores and secondary coils separately wound on the other vertical side arms thereof.

9. A magnetization characteristic measurement device as claimed in claim 7, further comprising a primary coil wound on said horizontal connecting arm and secondary coils separately wound on one vertical side arm.

10. A magnetization characteristic measurement device as claimed in claim 7, further comprising primary coils wound in series on said two vertical side arms of said magnetic cores and secondary coils wound in layers on one of said vertical side arms.

11. A magnetization characteristic measurement device as claimed in claim 6, wherein each of said magnetic cores comprises two cores shielded from each other with a shielding material.

12. A magnetization characteristic measurement device as claimed in claim 6, wherein said differential type magnetic head is formed by facing side surfaces of said magnetic cores to each other so as to comprise a multi-head type magnetic sensor.

13. A magnetization characteristic measurement device as claimed in claim 6, wherein said differential type magnetic head is formed by facing front and back surfaces of said magnetic cores to each other so as to comprise a multi-head type magnetic sensor.

14. A magnetization characteristic measurement device as claimed in claim 6, wherein said excitation signal generating means generates a low frequency triangle wave signal.

15. A magnetization characteristic measurement device as claimed in claim 14, wherein said excitation signal generating means comprises a clock pulse oscillator which generates clock pulses, a counter which counts the clock pulses, a ROM which stores respective digital data for triangle wave generation in accordance with a counted signal of the counter and a D/A converter which converts the output of the ROM into analog signal.

16. A magnetization characteristic measurement device as claimed in claim 6, wherein said measured data converting means includes a multiplexer which switches and inputs one of the output voltages from said differential type magnetic head, and an A/D converter which converts an inputted signal from the multiplexer into digital signals.

17. A magnetization characteristic measurement device as claimed in claim 6, wherein said measured data analyzing means includes a CPU which reads out data from a memory and operates a software integration, and a ROM which stores a control program.

18. A magnetization characteristic measurement device as claimed in claim 17, wherein said measured data analyzing means further includes a display means for displaying obtained magnetization characteristics.

* * * * *